United States Patent
Yamashita et al.

(10) Patent No.: US 11,823,966 B2
(45) Date of Patent: Nov. 21, 2023

(54) WIRING SUBSTRATE, ELECTRONIC DEVICE, AND ELECTRONIC MODULE

(71) Applicant: KYOCERA Corporation, Kyoto (JP)

(72) Inventors: Kyohei Yamashita, Kyoto (JP); Yoshihiro Hosoi, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 116 days.

(21) Appl. No.: 17/297,890

(22) PCT Filed: Nov. 29, 2019

(86) PCT No.: PCT/JP2019/046867
§ 371 (c)(1),
(2) Date: May 27, 2021

(87) PCT Pub. No.: WO2020/111256
PCT Pub. Date: Jun. 4, 2020

(65) Prior Publication Data
US 2022/0037220 A1 Feb. 3, 2022

(30) Foreign Application Priority Data
Nov. 30, 2018 (JP) .................. 2018-224350

(51) Int. Cl.
*H05K 1/02* (2006.01)
*H05K 1/03* (2006.01)
(Continued)

(52) U.S. Cl.
CPC ........... *H01L 23/14* (2013.01); *H05K 1/0271* (2013.01); *H05K 1/0306* (2013.01); *H05K 3/388* (2013.01);
(Continued)

(58) Field of Classification Search
CPC ... H01L 23/14; H01L 23/49866; H01L 23/15; H05K 1/0271; H05K 1/0306; H05K 3/388; H05K 2201/09036; H05K 3/181; C04B 2237/068; C04B 2237/366; C04B 2237/407; C04B 2237/58; C04B 2237/64; C04B 37/025
See application file for complete search history.

(56) References Cited

U.S. PATENT DOCUMENTS 5,326,623 A * 7/1994 Yamakawa ........... H01L 23/538
428/209
5,807,626 A * 9/1998 Naba .................. B23K 35/3006
428/673

(Continued)

FOREIGN PATENT DOCUMENTS

JP    05-182926 A    7/1993
JP    05-218229 A    8/1993

*Primary Examiner* — Ishwarbhai B Patel
(74) *Attorney, Agent, or Firm* — Volpe Koenig

(57) ABSTRACT

A wiring substrate includes an insulating substrate, a conductor layer and an interlayer. The insulating substrate contains AlN. The conductor layer contains Cu. The interlayer is located between the insulating substrate and the conductor layer. In the interlayer, between a first region near the insulating substrate and a second region near the conductor layer, Cu concentration is higher in the second region than in the first region, and Al concentration is higher in the first region than in the second region.

18 Claims, 4 Drawing Sheets

(51) Int. Cl.
  *H05K 1/18*    (2006.01)
  *H01L 23/14*   (2006.01)
  *H05K 3/38*    (2006.01)
  *H05K 1/11*    (2006.01)

(52) U.S. Cl.
  CPC .............. *H05K 1/03* (2013.01); *H05K 1/11* (2013.01); *H05K 1/18* (2013.01); *H05K 2201/09036* (2013.01)

(56) References Cited

U.S. PATENT DOCUMENTS

| | | | |
|---|---|---|---|
| 2009/0207580 A1* | 8/2009 | Oshika | H05K 1/111 216/13 |
| 2017/0062305 A1 | 3/2017 | Terasaki et al. | |
| 2017/0323842 A1* | 11/2017 | Tani | C04B 37/026 |
| 2020/0006213 A1* | 1/2020 | Terasaki | C04B 37/023 |

\* cited by examiner

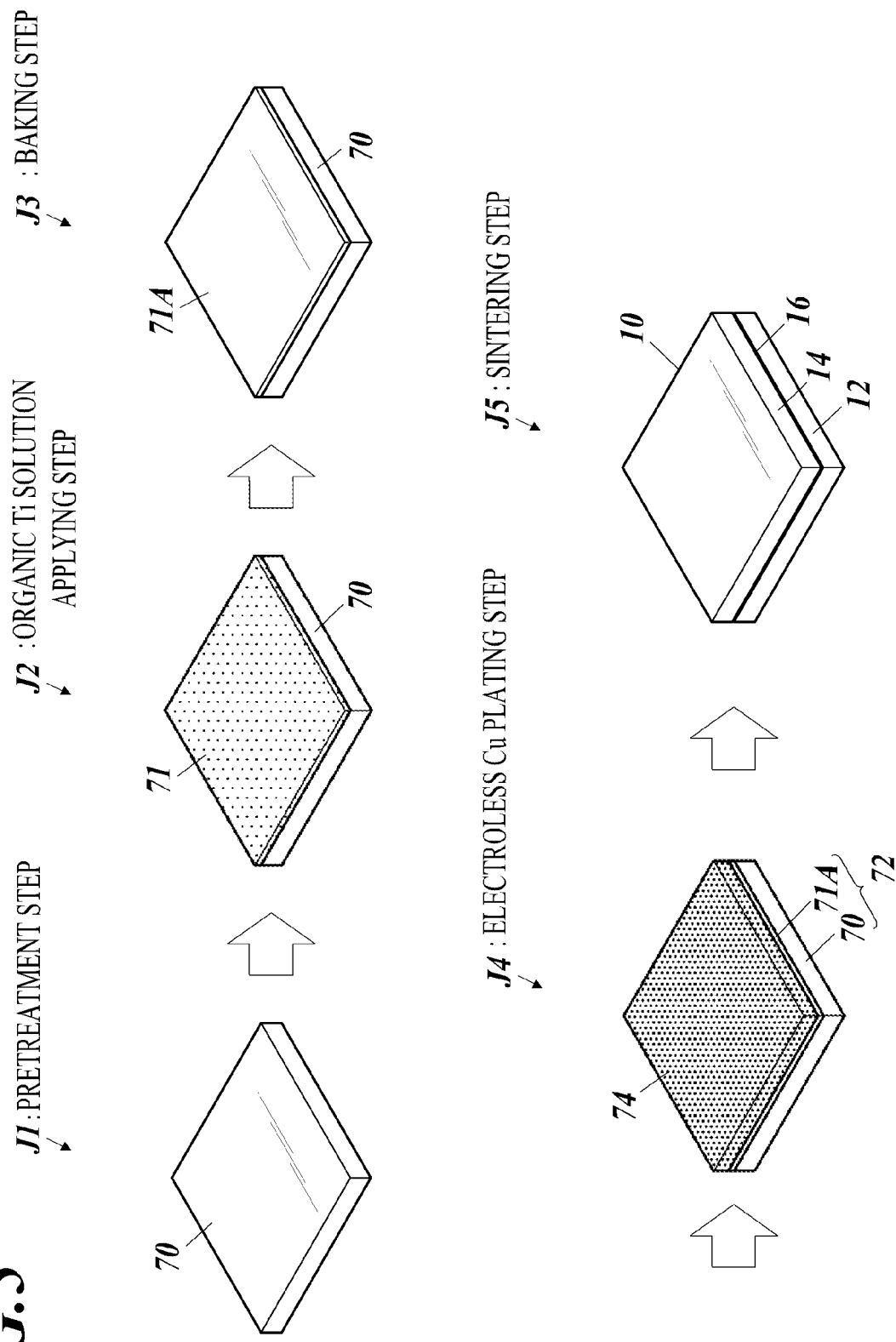

WIRING SUBSTRATE, ELECTRONIC DEVICE, AND ELECTRONIC MODULE

TECHNICAL FIELD

The present disclosure relates to a wiring substrate, an electronic device and an electronic module.

BACKGROUND

In JPH 5-182926 A, there is disclosed a manufacturing method of a wiring substrate in which an Al (aluminum)-based wiring is disposed on a substrate with a barrier metal layer in between. In this manufacturing method, after a small-diameter connecting hole is formed in the surface of the substrate, the barrier metal layer and the wiring layer are successively formed by sputtering. As the barrier metal layer, a Ti-based material is used.

SUMMARY

A wiring substrate according to the present disclosure includes:
  an insulating substrate containing AlN;
  a conductor layer containing Cu; and
  an interlayer located between the insulating substrate and the conductor layer,
  wherein in the interlayer, between a first region near the insulating substrate and a second region near the conductor layer,
    Cu concentration is higher in the second region than in the first region, and
    Al concentration is higher in the first region than in the second region.

An electronic device according to the present disclosure includes:
  the above wiring substrate; and
  an electronic component mounted on the wiring substrate.

An electronic module according to the present disclosure includes:
  the above electronic device; and
  a module board where the electronic device is mounted.

BRIEF DESCRIPTION OF DRAWINGS

FIG. 5 is a diagram to explain an example of a manufacturing method of the wiring substrate of the embodiment.

DETAILED DESCRIPTION

Hereinafter, an embodiment(s) of the present disclosure will be described in detail with reference to the drawings.

Figure 1A:
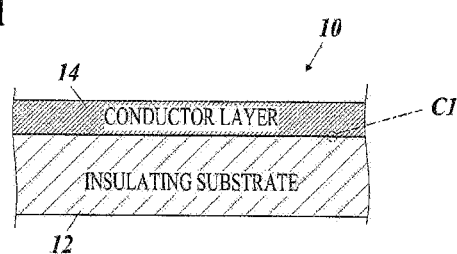
FIG. 1A shows a wiring substrate according to an embodiment of the present disclosure.
Figure 1B:
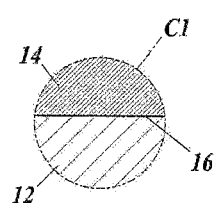
FIG. 1B is a part-enlarged view of a part of the wiring substrate shown in FIG. 1A.
Figure 1C:
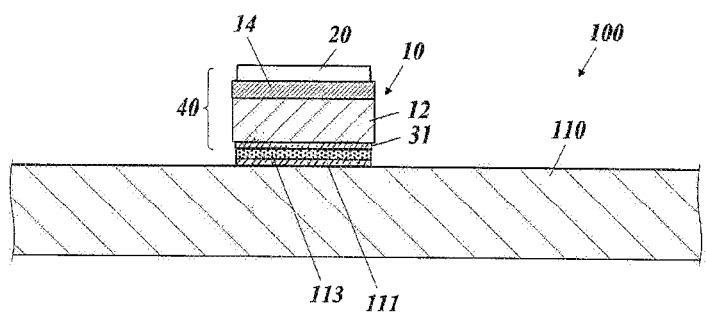
FIG. 1C shows an electronic module according to the embodiment of the present disclosure.

FIG. 1A is a sectional view of a wiring substrate according to an embodiment of the present disclosure. FIG. 1B is a part-enlarged view of a part of the wiring substrate shown in FIG. 1A. FIG. 1C is a sectional view of an electronic module according to the embodiment of the present disclosure.

A wiring substrate 10 of this embodiment has an insulating substrate 12 and a conductor layer 14 formed on the plate surface of the insulating substrate 12. The conductor layer 14 is formed with a pattern on the insulating substrate 12, and functions as a wiring for transmitting signals or electric power or functions as an electrode or a connection pad for connecting an electronic component 20, such as an optical element. In the insulating substrate 12 and on the back surface of the insulating substrate 12 (on a side thereof opposite the conductor layer 14), a wiring(s) and/or a connection pad(s) 31 (FIG. 1C) may also be provided. The wiring substrate 10 may be a package having a recess where the electronic component 20 is housed.

An electronic device 40 of this embodiment is, as shown in FIG. 1C, configured by mounting the electronic component 20 on the wiring substrate 10 shown in FIG. 1A. The electronic component 20 is mounted such that a terminal of the electronic component 20 is electrically connected to the conductor layer 14. The connection form of the terminal of the electronic component 20 to the conductor layer 14 may be any form, examples of which include connection with a joining material, such as solder, and connection by wire bonding. In FIG. 1C, the electronic component 20 is mounted on the conductor layer 14, but may be mounted, of the wiring substrate 10, a portion where the conductor layer 14 is not present. As the electronic component 20, various electronic components are applicable, which include: optical elements, such as an LD (Laser Diode), a PD (Photo Diode) and an LED (Light Emitting Diode); imagers, such as a CCD (Charge Coupled Device) and a CMOS (Complementary Metal Oxide Semiconductor) device; piezoelectric vibrators, such as a crystal oscillator; surface acoustic wave devices; semiconductor devices, such as a semiconductor integrated circuit (IC) device; electric capacitors; inductors; and resistors.

An electronic module 100 of this embodiment is, as shown in FIG. 1C, configured by mounting the electronic device 40 on a module board 110. On the module board 110, in addition to the electronic device 40, other electronic component(s) and/or electric component(s) may be mounted. The module board 110 has a circuit wiring and a connection pad 111 that connects components. The electronic device 40 can be mounted on the module board 110, for example, via (with) a joining material 113, such as solder.

<Wiring Substrate>

The insulating substrate 12 of the wiring substrate 10 contains AlN (aluminum nitride) as a main component of constituent elements. The conductor layer 14 contains Cu (copper) as a constituent element. At the interface between the insulating substrate 12 and the conductor layer 14, an interlayer 16 is present. The interlayer 16 has a thickness of about 20 nm to 80 nm.

Figure 2A:
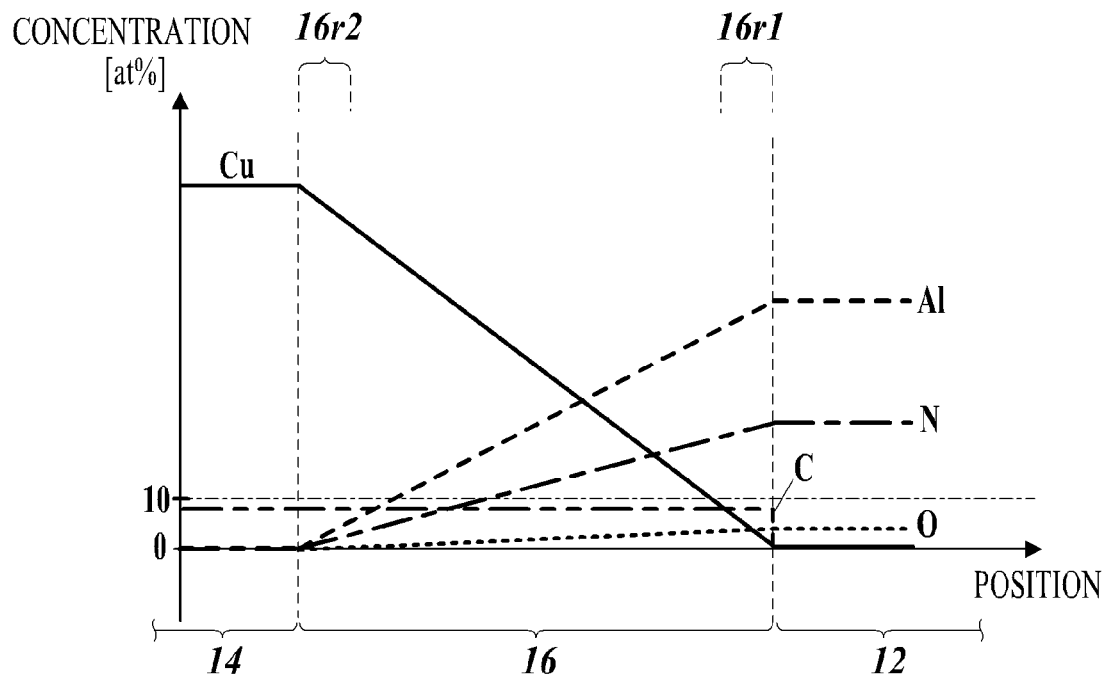
FIG. 2A shows concentration distributions of constituent elements in and around an interlayer of the wiring substrate of the embodiment.
Figure 2B:
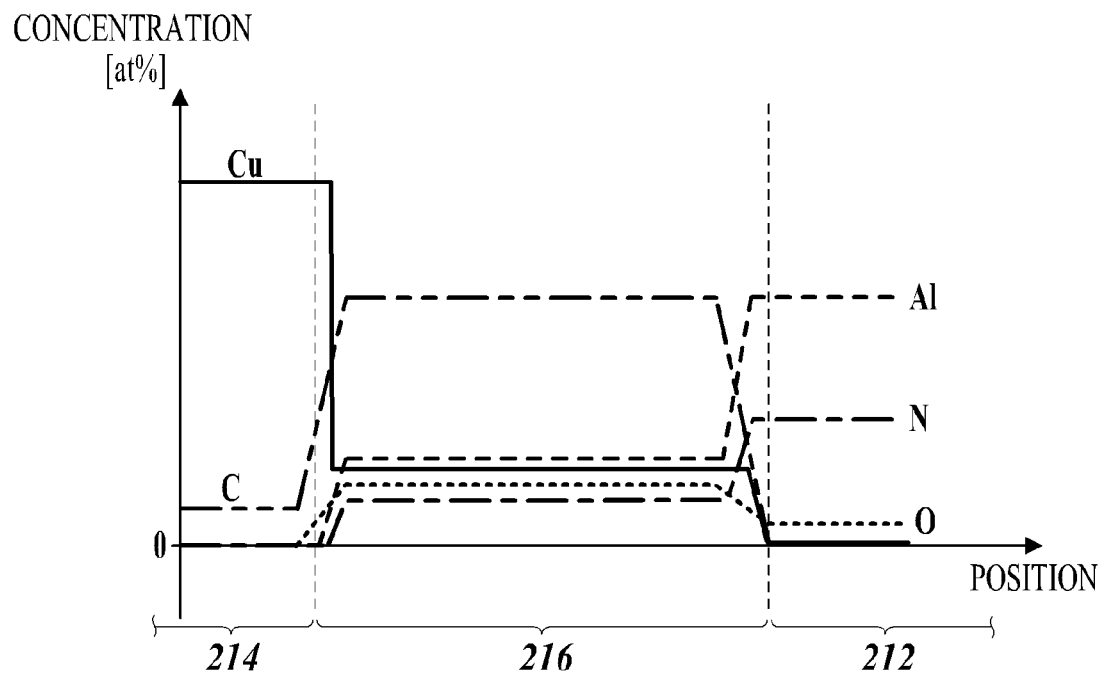
FIG. 2B shows concentration distributions of the constituent elements in and around an interlayer of a comparative example.

FIG. 2A shows concentration distributions of constituent elements in and around the interlayer of the wiring substrate of the embodiment. FIG. 2B shows concentration distributions of the constituent elements in and around an interlayer of a comparative example. The constituent elements of the interlayer 16 and the concentration distributions of the constituent elements in the interlayer 16 described hereinafter were obtained by measurement with TEM-EELS (Electron Energy-Loss Spectroscopy). The concentration distributions are expressed by concentrations with at % (atomic percent). The graphs shown in FIG. 2A and FIG. 2B do not show values of the concentration distributions precisely, but show changes of the values in a simplified manner.

As shown in FIG. 2A, the interlayer 16 contains Al (aluminum), N (nitrogen) and Cu (copper). If, among regions of the interlayer 16, a first region 16r1 near the insulating substrate 12 is compared with a second region 16r2 near the conductor layer 14, Cu concentration is higher in the second region 16r2 than in the first region 16r1. Further, Al concentration is higher in the first region 16r1 than in the second region 16r2. Still further, N concentration may be higher in the first region 16r1 than in the second region 16r2. In the interlayer 16, The Al and N concentrations may gradually decrease in a direction from the insulating substrate 12 to the conductor layer 14. The first region 16r1 and the second region 16r2 are two regions that do not overlap one another and have an arbitrary thickness (e.g. a thickness of 10% of the interlayer 16) in the layer direction. The first region 16r1 may be a region closer to the insulating substrate 12 than the second region 16r2 is, and the second region 16r2 may be a region closer to the conductor layer 14 than the first region 16r1 is. Alternatively, the first region 16r1 may be a region closer to the insulating substrate 12 than to the center of the interlayer 16, and the second region 16r2 may be a region closer to the conductor layer 14 than to the center of the interlayer 16.

The constituent elements of the interlayer 16 may have the following concentration distributions, to be more specific. That is, Al and N concentration gradients are each a gradient in which the closer the position in the interlayer 16 is to the conductor layer 14, the lower the concentration is, and Cu concentration gradient is a gradient in which the closer the position in the interlayer 16 is to the conductor layer 14, the higher the concentration is. These concentration gradients may exist from the conductor layer 14 side to the insulating substrate 12 side of the interlayer 16.

The interlayer 16 may further contain C (carbon). If the interlayer 16 contains C, however, C concentration of the interlayer 16 is 10 at % or less. The conductor layer 14 may further contain C the same as the interlayer 16. C concentration of the conductor layer 14 may be 10 at % or less the same as C concentration of the interlayer 16.

FIG. 2B, which shows the comparative example, shows the concentration distributions of the constituent elements of the interface not subjected to sintering under predetermined conditions described below. In the comparative example, changes of the concentrations of the constituent elements (Al, N, Cu) are steep on an insulating substrate 212 side of an interlayer 216 and on a conductor layer 214 side of the interlayer 216.

Further, the interlayer 216 of the comparative example has high C concentrations and has a portion(s) containing C at a concentration equal to or more than the sum of the Al, N and Cu concentrations, for example. If the conductor layer 214 is generated by plating, carbon component contained in the plating solution gets mixed in the interlayer 216, and the interlayer 216, which is not subjected to the sintering under predetermined conditions described below, has high C concentrations.

<Adhesive Component>

Figure 3:
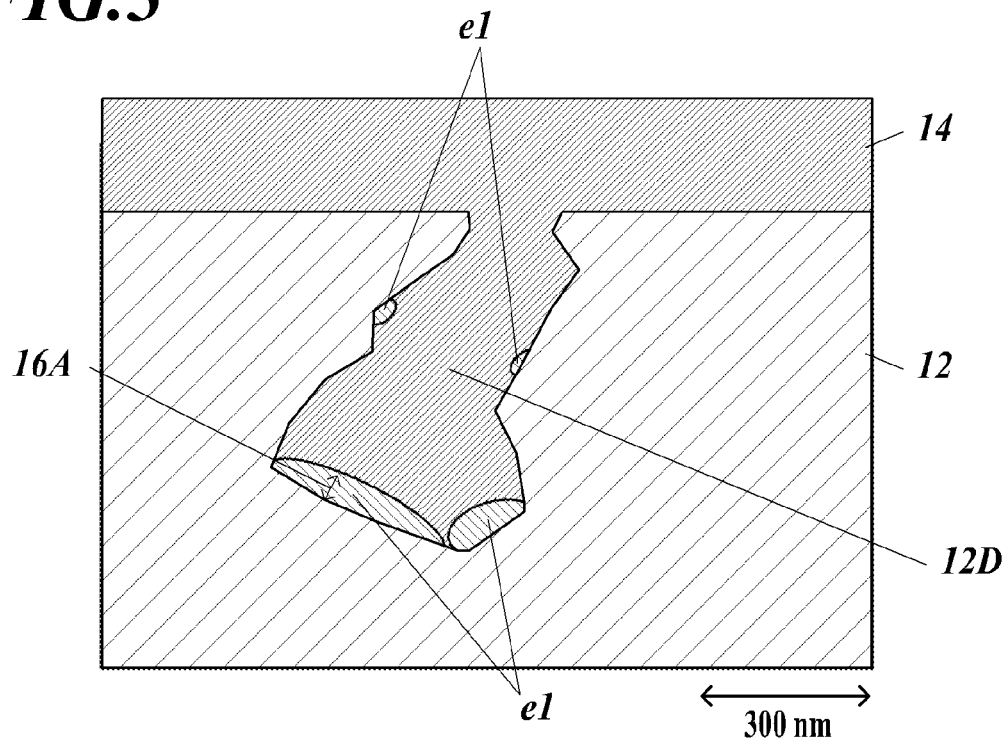
FIG. 3 is a sectional view of structure at and around an interface of an insulating substrate.

FIG. 3 is a sectional view of structure at and around an interface of an insulating substrate.

The insulating substrate 12 has a large number of fine recesses 12D, each of which is as shown in FIG. 3, at the interface between itself and the conductor layer 14. The constituent element(s) of the conductor layer 14 enters each recess 12D, and the interlayer 16 is formed between the insulating substrate 12 and the conductor layer 14 not only at the interface of the region outside the recess 12D but also on the inner surface of the recess 12D. The element components and the concentration distributions of the interlayer 16 are as described with reference to FIG. 2A.

On the inner surface of the recess 12D, adhesive regions el containing $TiO_2$ (titanium oxide) as a constituent element are scattered. The adhesive regions el may also be scattered at the interface between the insulating substrate 12 and the conductor layer 14 of the region outside the recess 12D. The "scattered" means that at the interface between the insulating substrate 12 and the conductor layer 14, the adhesive region(s) el and region(s) other than the adhesive region(s) el coexist.

Figure 4:
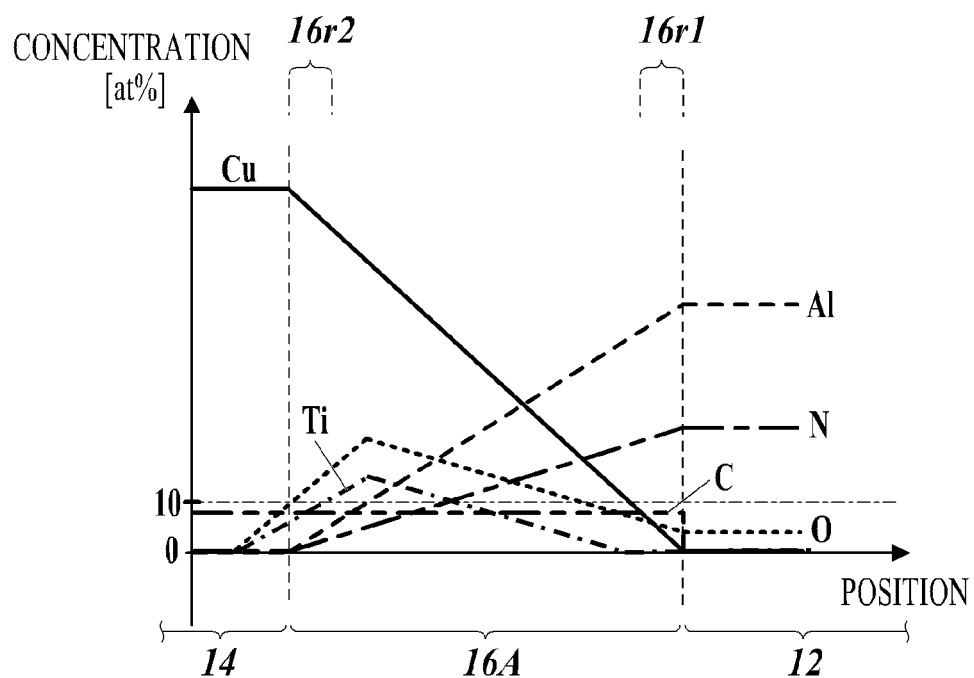
FIG. 4 shows concentration distributions of constituent elements in and around the interface in a recess.

Next, an interlayer 16A at a portion including the adhesive region el will be described. The interlayer 16A at the portion including the adhesive region el and the interlayer 16 at a portion not including the adhesive region el are distinguished from one another by these different reference signs. FIG. 4 shows concentration distributions of constituent elements in and around the interface including the adhesive region(s) el in a recess. The graph shown in FIG. 4 does not show values of the concentration distributions precisely, but show changes of the values in a simplified manner.

The interlayer 16A contains Al, N, Cu, Ti (titanium) and O (oxygen). In the interlayer 16A too, Al, N and Cu concentration gradients in which Al, N and Cu concentrations gradually change exist. Directions of the Al, N and Cu concentration gradients are the same as those of the Al, N and Cu concentration gradients in the interlayer 16 described above. The Al, N and Cu concentration gradients exist from the insulating substrate 12 side to the conductor layer 14 side of the interlayer 16A. In the interlayer 16A too, the C concentration is 10 at % or less.

Since the interlayer 16A contains Ti and O too, counter diffusion of Cu and Al is promoted in the sintering under predetermined conditions described below. Hence, the Al, N and Cu concentration gradients in the interlayer 16A are gentle as compared with those in the interlayer 16 at the portion not including the adhesive region el.

Further, in the interlayer 16A including the adhesive region el, O (oxygen) concentration gradient occurs on the conductor layer 14 side, so that adhesive strength of the conductor layer 14 is increased. Increase of the adhesive strength between the insulating substrate 12 and the conductor layer 14 in the recess 12D further increases the adhesive strength between the insulating substrate 12 and the conductor layer 14 as a whole.

<Adhesive Strength>

A test was carried out to obtain the adhesive strength between the conductor layer 14 and the insulating substrate 12 about the wiring substrate 10 of the embodiment and a board not subjected to the sintering under predetermined conditions described below. As the test method, to a first jig fixed to the insulating substrate 12 and a second jig fixed to the conductor layer 14, pull force in a direction to separate these from one another in a direction perpendicular to the interface was applied, and the maximum pull strength was measured as the adhesive strength. As the pull force is increased, the interface between the insulating substrate 12 and the conductor layer 14 fractures, or the insulating substrate 12 fractures. As a fracture mode, a proportion of fracture of the insulating substrate 12 was obtained.

Three objects were tested, which were a board not subjected to sintering, a board subjected to sintering under conditions different from predetermined conditions described below, and the wiring substrate 10 of the embodiment subjected to the sintering under predetermined conditions described below and having the interface where the adhesive regions el were scattered.

As a result of the test, as shown in the following comparison table, a great improvement was observed in the adhesive strength of the wiring substrate 10 of the embodiment.

TABLE I

[COMPARISON TABLE]

| TREATMENT | FRACTURE MODE | ADHESIVE STRENGTH [kgf/mm$^2$] |
|---|---|---|
| NO SINTERING | FRACTURE OF INSULATING SUBSTRATE: 0% | 2.59 |
| DIFFERENT SINTERING | FRACTURE OF INSULATING SUBSTRATE: 20% | 3.79 |
| SINTERING UNDER BELOW-DESCRIBED PREDETERMINED CONDUCTIONS | FRACTURE OF INSULATING SUBSTRATE: 100% | 5.83 |

<Manufacturing Method>

FIG. 5 is a diagram to explain an example of a manufacturing method of the wiring substrate of the embodiment.

The manufacturing method of the embodiment includes, in chronological order, a pretreatment step J1 of cleaning and drying an AlN substrate 70, a step J2 of applying an organic Ti solution 71 to the AlN substrate 70, and a baking step J3 of baking the AlN substrate 70 to which the organic Ti solution 71 has been applied. In the pretreatment step J1, anisotropic etching using an agent or reactive ions may be performed to form the fine recesses 12D in the surface of the AlN substrate 70. In the baking step J3, baking is performed under conditions of 400° C. or higher and 30 minutes or longer. Thus, the organic Ti solution 71 solidifies and becomes a titanium oxide layer 71A. This manufacturing method further includes a step J4 of applying electroless Cu plating 74 to a substrate 72 after the baking and cooling, and a sintering step J5 of performing sintering thereon.

In this manufacturing method, since the titanium oxide and the conductor layer 14 are formed by the applying, baking and plating, the wiring substrate 10 can be manufactured at low cost.

In the sintering step J5, in an atmosphere of an inert gas, sintering is performed under conditions of 300° C. or higher and 30 minutes or longer. Through the sintering under these conditions, Cu of the electroless Cu plating 74 reaches the AlN substrate 70 through the titanium oxide layer 71A, so that at the interface, the interlayer 16 having Al, N and Cu concentration gradients is formed.

Further, through the sintering under the conditions, C (carbon) component of the interlayer 16 diffuses from the interface to the electroless Cu plating 74 side. In addition, through the sintering under the conditions, the C component of the electroless Cu plating 74 reacts with O (oxygen) component contained in the plating solution, and disperses to the outside as CO gas or $CO_2$ gas. Thus, C concentration of the interlayer 16 decreases to 10 at % or less.

Further, through the sintering under the conditions, the titanium oxide layer 71A changes to the adhesive regions el scattered at the interface, and at the position of each adhesive region el, the interlayer 16A containing Ti and O is formed.

As described above, according to the wiring substrate 10 of this embodiment, if, of the interlayer 16, the first region 16r1 near the insulating substrate 12 and the second region 16r2 near the conductor layer 14 are compared with one another, the Cu concentration is higher in the second region 16r2 than in the first region 16r1. Further, the Al concentration is higher in the first region 16r1 than in the second region 16r2. Due to these concentration gradients, from the insulating substrate 12 side to the conductor layer 14 side of the interlayer 16, change in coefficient of thermal expansion is gentle. This can reduce stress concentration due to difference in coefficient of thermal expansion between films, and achieve high adhesive strength between the insulating substrate 12 and the conductor layer 14.

Further, in the interlayer 16, the N concentration is higher in the first region 16r1 near the insulating substrate 12 than in the second region 16r2 near the conductor layer 14. Hence, change in coefficient of thermal expansion in the interlayer 16 is gentler. This can further reduce stress concentration due to difference in coefficient of thermal expansion between films, and achieve higher adhesive strength between the insulating substrate 12 and the conductor layer 14. Similarly, in the interlayer 16, the AL and N concentrations gradually decrease in the direction from the insulating substrate 12 to the conductor layer 14. Hence, change in coefficient of thermal expansion in the interlayer 16 is gentler. This can further reduce stress concentration due to difference in coefficient of thermal expansion between films, and achieve higher adhesive strength between the insulating substrate 12 and the conductor layer 14.

Further, according to the wiring substrate 10 of this embodiment, at the interface of the region outside the fine recesses 12D of the insulating substrate 12 and on the inner surfaces of the recesses 12D, the interlayer(s) 16 having Al, N and Cu concentration gradients is present. This can achieve higher adhesive strength between the insulating substrate 12 and the conductor layer 14.

Further, according to the wiring substrate 10 of this embodiment, on the inner surfaces of the recesses 12D, the interlayer(s) 16A containing Ti and O is scattered. Ti and O forming no layer but being scattered can achieve gentler Al, N and Cu concentration gradients at portions where the interlayer 16A containing Ti and O is scattered and therearound, and accordingly achieve higher adhesive strength of the interface. Further, achieving higher adhesive strength inside the recesses 12D can further increase the adhesive strength between the insulating substrate 12 and the conductor layer 14 as a whole.

Further, according to the wiring substrate 10 of this embodiment, in the interlayers 16, 16A, the C concentration is 10 at % or less. If C occupies an interface, strength of the interface decreases. In this embodiment, decrease of the strength due to C of the interface is suppressed. The structural element having the above C concentration and its effect are especially effective if the conductor layer 14 is formed by plating.

Further, according to the electronic device 40 and the electronic module 100 of this embodiment, the wiring substrate 10 in which the adhesive strength of the conductor layer 14 is high is used. This exhibits an effect of achieving high reliability.

In the above, an embodiment(s) of the present disclosure has been described. However, the present disclosure is not limited to the above embodiment. For example, in the above embodiment, at the interface between the insulating substrate 12 and the conductor layer 14, the adhesive regions containing Ti and O are scattered, but this structure may not be provided. Further, the C (carbon) concentration of the interlayer may be different from that described in the above embodiment. Further, in the above embodiment, an example of the manufacturing method of the wiring substrate has been described, but the wiring substrate according to the present disclosure may be manufactured by a manufacturing method different from that of the above embodiment. Further, the details described in the above embodiment can be appropriately modified within a range not departing from the scope of the disclosure.

INDUSTRIAL APPLICABILITY

The present disclosure is applicable to a wiring substrate, an electronic device and an electronic module.

The invention claimed is:

1. A wiring substrate comprising:
an insulating substrate having a first surface and containing AlN;
a conductor layer located on the first surface and containing Cu; and
an interlayer located between the insulating substrate and the conductor layer and containing Cu, Al and N,
wherein in the interlayer, between a first region near the insulating substrate and a second region near the conductor layer,
Cu concentration is higher in the second region than in the first region, and
Al concentration is higher in the first region than in the second region, and
wherein the Al concentration of the interlayer is higher than N concentration of the interlayer in the first region.

2. The wiring substrate according to claim 1, wherein N concentration is higher in the first region than in the second region.

3. The wiring substrate according to claim 2, wherein in the interlayer, the Al concentration and N concentration gradually decrease in a direction from the insulating substrate to the conductor layer.

4. The wiring substrate according to claim 3,
wherein the insulating substrate has a plurality of recesses on a conductor layer side thereof, and
wherein the interlayer is present outside the recesses and in the recesses.

5. The wiring substrate according to claim 2,
wherein the insulating substrate has a plurality of recesses on a conductor layer side thereof, and
wherein the interlayer is present outside the recesses and in the recesses.

6. The wiring substrate according to claim 2, wherein the N concentration of the interlayer is lower than the Cu concentration of the interlayer at a position in the first region.

7. The wiring substrate according to claim 6, wherein the N concentration of the interlayer is higher than the Cu concentration of the interlayer at another position in the first region, the another position being closer to the insulating substrate than the position.

8. The wiring substrate according to claim 1, wherein in the interlayer, the Al concentration and N concentration gradually decrease in a direction from the insulating substrate to the conductor layer.

9. The wiring substrate according to claim 8,
wherein the insulating substrate has a plurality of recesses on a conductor layer side thereof, and
wherein the interlayer is present outside the recesses and in the recesses.

10. The wiring substrate according to claim 1,
wherein the insulating substrate has a plurality of recesses on a conductor layer side thereof, and
wherein the interlayer is present outside the recesses and in the recesses.

11. The wiring substrate according to claim 10, wherein the interlayer further contains Ti and O.

12. The wiring substrate according to claim 10, wherein Ti of the interlayer is scattered at an interface of the insulating substrate in the recesses.

13. The wiring substrate according to claim 1, wherein from an insulating substrate side to a conductor layer side of the interlayer, C concentration is 10 at % or less.

14. An electronic device comprising:
the wiring substrate according to claim 1; and
an electronic component mounted on the wiring substrate.

15. An electronic module comprising:
the electronic device according to claim 8; and
a module board where the electronic device is mounted.

16. A wiring substrate comprising:
an insulating substrate having a first surface and containing AN;
a conductor layer located on the first surface and containing Cu; and
an interlayer located between the insulating substrate and the conductor layer and containing Cu, Al and Ti,
wherein the interlayer has a first region and a second region closer to the conductor layer than the first region,
wherein Cu concentration is higher in the second region than in the first region,
wherein Al concentration is higher in the first region than in the second region,
wherein the first surface has a recess,
wherein a part of the conductor layer is located in the recess,
wherein in a sectional view, the interlayer has a first portion, a second portion apart from the first portion, and a third portion between the first portion and the second portion so as to be adjacent thereto, and the first portion, the second portion and the third portion are located along a surface of the recess,
wherein the first portion and the second portion contain Ti, and
wherein the third portion does not contain Ti.

17. The wiring substrate according to claim 16,
wherein the recess includes an opening end,
wherein in the sectional view, a width of the recess differs according to a depth,
wherein in the sectional view, the width of the recess at a position inside the recess is greater than the width at the opening end, and
wherein the conductor layer has a portion the width of which is greater than the width at the opening end in the sectional view.

18. The wiring substrate according to claim 17, wherein the width of the recess at the position is greater than 300 nm, and the width at the opening end is less than 300 nm.

* * * * *